United States Patent
Yamamoto

(10) Patent No.: US 7,432,146 B2
(45) Date of Patent: Oct. 7, 2008

(54) SEMICONDUCTOR DEVICE AND MANUFACTURING METHOD THEREOF

(75) Inventor: Tomonari Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 114 days.

(21) Appl. No.: 10/083,684

(22) Filed: Feb. 27, 2002

(65) Prior Publication Data

US 2002/0121654 A1   Sep. 5, 2002

(30) Foreign Application Priority Data

Mar. 2, 2001  (JP) .............................. 2001-059060
Jan. 31, 2002  (JP) .............................. 2002-024468

(51) Int. Cl.
   *H01L 21/336* (2006.01)
(52) U.S. Cl. ..................... 438/197; 438/199; 438/305; 257/E21.335; 257/E21.634
(58) Field of Classification Search .............. 257/192, 257/193, 194, 70, 69, 68, 71, E21.335, E21.336, 257/E21.633, E21.345, E21.347; 438/305, 438/150, 199, 166, 981, 156, 197, 308, 372, 438/486
   See application file for complete search history.

(56) References Cited

U.S. PATENT DOCUMENTS

| | | | | |
|---|---|---|---|---|
| 4,056,825 A | * | 11/1977 | Esch ........................... | 257/386 |
| 5,308,780 A | * | 5/1994 | Chou et al. .................. | 438/302 |
| 5,514,880 A | * | 5/1996 | Nishimura et al. ............ | 257/70 |
| 5,698,869 A | * | 12/1997 | Yoshimi et al. .............. | 257/192 |
| 5,705,410 A | * | 1/1998 | Guegan ....................... | 438/302 |
| 5,712,191 A | * | 1/1998 | Nakajima et al. ............ | 438/487 |
| 5,736,438 A | * | 4/1998 | Nishimura et al. .......... | 438/166 |
| 5,824,574 A | * | 10/1998 | Yamazaki et al. ........... | 438/150 |
| 5,908,307 A | * | 6/1999 | Talwar et al. ................ | 438/199 |
| 6,017,781 A | * | 1/2000 | Shimizu et al. ............. | 438/158 |
| 6,083,781 A | * | 7/2000 | Zolper et al. ................ | 438/167 |
| 6,093,610 A | * | 7/2000 | Rodder ....................... | 438/289 |
| 6,245,622 B1 | * | 6/2001 | Kawaguchi ................. | 438/305 |
| 6,335,253 B1 | * | 1/2002 | Chong et al. ................ | 438/305 |
| 6,380,044 B1 | * | 4/2002 | Talwar et al. ............... | 438/308 |
| 6,391,695 B1 | * | 5/2002 | Yu .............................. | 438/166 |
| 6,432,802 B1 | * | 8/2002 | Noda et al. .................. | 438/585 |
| 6,855,954 B1 | * | 2/2005 | Zhang .......................... | 257/59 |
| 6,906,548 B1 | * | 6/2005 | Toshiyuki et al. ........... | 324/769 |

\* cited by examiner

*Primary Examiner*—Thomas L. Dickey
*Assistant Examiner*—Fazli Erdem
(74) *Attorney, Agent, or Firm*—Westerman, Hattori, Daniels & Adrian, LLP.

(57) ABSTRACT

To make it possible to obtain a sharp impurity profile without presenting a disadvantage such as an increase in parasitic resistance or the like using a laser annealing method to thereby meet sufficiently the requirements for making a semiconductor element finer and more highly integrated. A gate electrode is pattern formed above a semiconductor substrate made of n-type silicon single crystal through a gate insulating film. Thereafter, atoms, $Ge^+$ here, having properties just enough to amorphize single crystal Si are ion implanted (shown by arrows) from oblique directions to the Si surface of the substrate with the gate electrode as a mask to melt and re-crystallize the single crystal Si so as to form amorphous regions which seep into the substrate under the gate electrode. Thereafter $B^+$ ions are implanted into the amorphous regions and laser irradiation is executed thereon.

21 Claims, 9 Drawing Sheets

PARTS UNDER GATE ELECTRODE ALSO AMORPHOUSIZED
BY OBLIQUE AMORPHOUSIZING IMPLANTATION
(IMPURITIES IN THESE PARTS ACTIVATED)

SECONDARY ION MASS SPECTROMETRY

SOURCE/DRAINS HAVING PARTS UNDER GATE ELECTRODE
ALSO AMORPHOUSIZED FORMED BY CONTROLLING ION
IMPLANTATION CONDITION AND LASER IRRADIATION CONDITION
(IMPURITIES IN THESE PARTS ACTIVATED)

SEMICONDUCTOR DEVICE AND MANUFACTURING METHOD THEREOF

CROSS-REFERENCE TO RELATED APPLICATIONS

This application is based upon and claims priority of Japanese Patent Application Nos. 2001-059060, filed on Mar. 2, 2001 and 2002-024468, filed on Jan. 31, 2002, the contents being incorporated herein by reference.

BACKGROUND OF THE INVENTION

1. Field of the Invention

The present invention relates to a method of manufacturing a semiconductor device and, more specifically, is preferably applied to the formation of a source and a drain in a MOS transistor of a generation having a gate length of less than 0.1 μm.

2. Description of the Related Art

In recent years, the laser annealing technique is expected as thermal process of the next generation, replacing rapid lamp heating. This technique, nonequilibrium thermal process which is a melting and re-crystallization process in a very short period of time of several nanoseconds, has advantages in its capability of obtaining high electrical activity exceeding the solubility limit of impurities in a semiconductor which is normally limited by temperature and, further, of obtaining a sharp impurity profile. Therefore, this technique enables the formation of a source and a drain having a low contact resistance and shallower and sharper impurity extension regions.

However, the sharp impurity extension obtained by the laser annealing has a disadvantage in that the impurity extension region in the vicinity of a gate electrode which is a mask during ion implantation is strictly defined because the impurity profile is too sharp, which inversely increases its parasitic resistance.

As described above, the use of the laser annealing method provides this sharp impurity profile due to the activating process in a very short period of time which greatly contributes to a reduction in the contact resistance and so on, but conversely presents a serious problem in the increase in parasitic resistance.

SUMMARY OF THE INVENTION

Therefore, the present invention is made in view of the aforementioned problem, and it is an object of the invention to provide a semiconductor device and a method of manufacturing thereof capable of making it possible to obtain a sharp impurity profile through the use of the laser annealing method without presenting a disadvantage such as an increase in parasitic resistance or the like, so as to make it possible to meet sufficiently the requirements for making a semiconductor element finer and more highly integrated.

As a result of intense consideration, the present inventor achieved the aspects of the invention shown as follows:

The manufacturing method of the present invention (first aspect) is for a method of manufacturing a semiconductor device having a gate, a source and a drain within a single crystal semiconductor region, including: a first step of pattern forming the gate above the single crystal semiconductor region through a gate insulating film; a second step of introducing atoms having properties just enough to amorphize the single crystal semiconductor from oblique directions to a surface of the single crystal semiconductor region with the gate as a mask to form amorphous regions seeping into the single crystal semiconductor region under the gate; before or after the second step, a third step of introducing impurities into the surface of the single crystal semiconductor region with the gate as a mask; and a fourth step of activating the impurities by executing laser irradiation on the single crystal semiconductor region to form the source and the drain.

Further, the invention (second aspect) is for a method of manufacturing a semiconductor device of a so-called LDD structure, including: a first step of pattern forming the gate above the single crystal semiconductor region through a gate insulating film; a second step of introducing atoms having properties just enough to amorphize the single crystal semiconductor from oblique directions to a surface of the single crystal semiconductor region with the gate as a mask to form first amorphous regions seeping into the single crystal semiconductor region under the gate; before or after the second step, a third step of introducing impurities into the surface of the single crystal semiconductor region with the gate as a mask to form first junction regions; a fourth step of forming a side wall insulating film on side surfaces of the gate; a fifth step of introducing atoms having properties just enough to amorphize the single crystal semiconductor into the surface of the single crystal semiconductor region with the gate and the side wall insulating film as a mask to form second amorphous regions which are deeper than the first amorphous regions; before or after the fifth step, a sixth step of introducing impurities into the surface of the single crystal semiconductor region with the gate and the side wall insulating film as a mask to form second junction regions which are deeper than the first junction regions; and a seventh step of removing the side wall insulating film and thereafter activating the impurities in the first and second junction regions by executing laser irradiation on the single crystal semiconductor region to form the source and the drain.

Further, a method of manufacturing a semiconductor device of the present invention (third aspect) includes the steps of: introducing atoms having properties just enough to amorphize a single crystal semiconductor using a predetermined mask at least twice under different introduction conditions to form each amorphous region having a different depth and area in accordance with each introduction of the atoms; introducing impurities for forming a pn junction before or after each introduction of the atoms; and activating the introduced impurities by executing laser irradiation on the single crystal semiconductor region to form the pn junction.

Further, a method of manufacturing a semiconductor of the present invention (fourth aspect) includes: a first step of pattern forming the gate above the single crystal semiconductor region through a gate insulating film; a second step of introducing atoms having properties to amorphize the single crystal semiconductor into a surface of the single crystal semiconductor region with the gate as a mask to form amorphous regions; before or after the second step, a third step of introducing impurities into the surface of the single crystal semiconductor region with the gate as a mask; and a fourth step of activating the impurities by executing laser irradiation on the single crystal semiconductor region to form the source and the drain, wherein conditions of introducing the atoms in the second step and conditions of intensity of the laser irradiation in the fourth step are controlled respectively to form parts of the source and the drain corresponding to the amorphous regions to seep into the single crystal semiconductor region under the gate.

Further, a method of manufacturing a semiconductor of the present invention (fifth aspect) includes: a first step of pattern forming the gate above the single crystal semiconductor region through a gate insulating film; a second step of forming a side wall insulating film on side surfaces of the gate and introducing impurities to form deep, first junction regions; a third step of removing the side wall insulating film and thereafter introducing atoms having properties just enough to amorphize the single crystal semiconductor into a surface of the single crystal semiconductor region with the gate as a mask to form amorphous regions; before or after the second step, a fourth step of introducing impurities into the surface of the single crystal semiconductor region with the gate as a mask to form shallow, second junction regions; and a fifth step of activating the impurities in the first and second junction regions by executing laser irradiation on the single crystal semiconductor region to form the source and the drain, wherein conditions of introducing the atoms in the third step and conditions of intensity of the laser irradiation in the fifth step are controlled respectively to form parts of the source and the drain corresponding to the amorphous regions to seep into the single crystal semiconductor region under the gate.

Further, a method of manufacturing a semiconductor of the present invention (sixth aspect) includes: a first step of pattern forming the gate above the single crystal semiconductor region through a gate insulating film; a second step of introducing atoms having properties just enough to amorphize the single crystal semiconductor from oblique directions to a surface of the single crystal semiconductor region with the gate as a mask to form amorphous regions seeping into the single crystal semiconductor region under the gate; before or after the second step, a third step of introducing impurities into the surface of the single crystal semiconductor region with the gate as a mask; and a fourth step of activating the impurities by executing laser irradiation on the single crystal semiconductor region to form the source and the drain, wherein in the second step, tilt angles of the introduction of the atoms with respect to a direction vertical to the surface of the single crystal semiconductor region are controlled to be greater on the source side than on the drain side so as to form the amorphous regions such that an amount of seeping into the single crystal semiconductor region under the gate is greater on the source side than on the drain side.

DETAILED DESCRIPTION OF THE PREFERRED EMBODIMENTS

Hereafter, concrete embodiments of a method of manufacturing a semiconductor device to which the present invention is applied will be described in detail with reference to the drawings.

Main Principle of the Present Invention

At the beginning, the main principle of the present invention is explained by illustrating the case in which the present invention is applied to manufacturing of a MOS transistor including a gate, a source and a drain.

The main configuration of the invention is in that in the case in which impurities are ion implanted into a semiconductor substrate made of Si single crystal to form impurity extension regions, and thereafter an annealing treatment is performed on the substrate to activate the impurities so as to form a source and a drain, the source and the drain are preferably formed using laser annealing for the annealing treatment.

Figure 1:
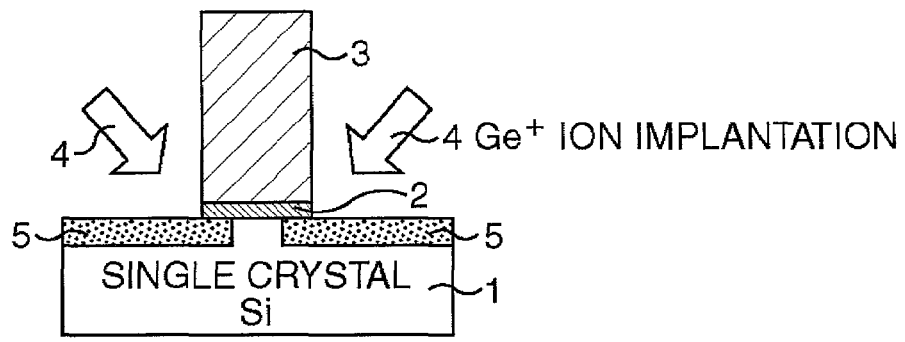
FIG. 1 is a schematic cross-sectional view illustrating manufacturing process of a MOS transistor for explaining a main configuration of the present invention.

Specifically, as shown in FIG. 1, a gate electrode 3 is pattern formed above a semiconductor substrate 1 made of n-type silicon single crystal through a gate insulating film 2. Thereafter, atoms, $Ge^+$ in this example, having properties just enough to amorphize single crystal Si are ion implanted (shown by arrows 4) from oblique directions to the Si surface of the substrate 1 with the gate electrode 3 as a mask to melt and re-crystallize the single crystal Si so as to form amorphous regions 5 which seep into the substrate 1 under the gate electrode 3. Thereafter p-type impurities, $B^+$ in this example, are ion implanted into the amorphous regions 5 and laser irradiation is executed thereon. Incidentally, the Ge implanting step and the B implanting step may be executed with their sequence changed.

Figure 2:
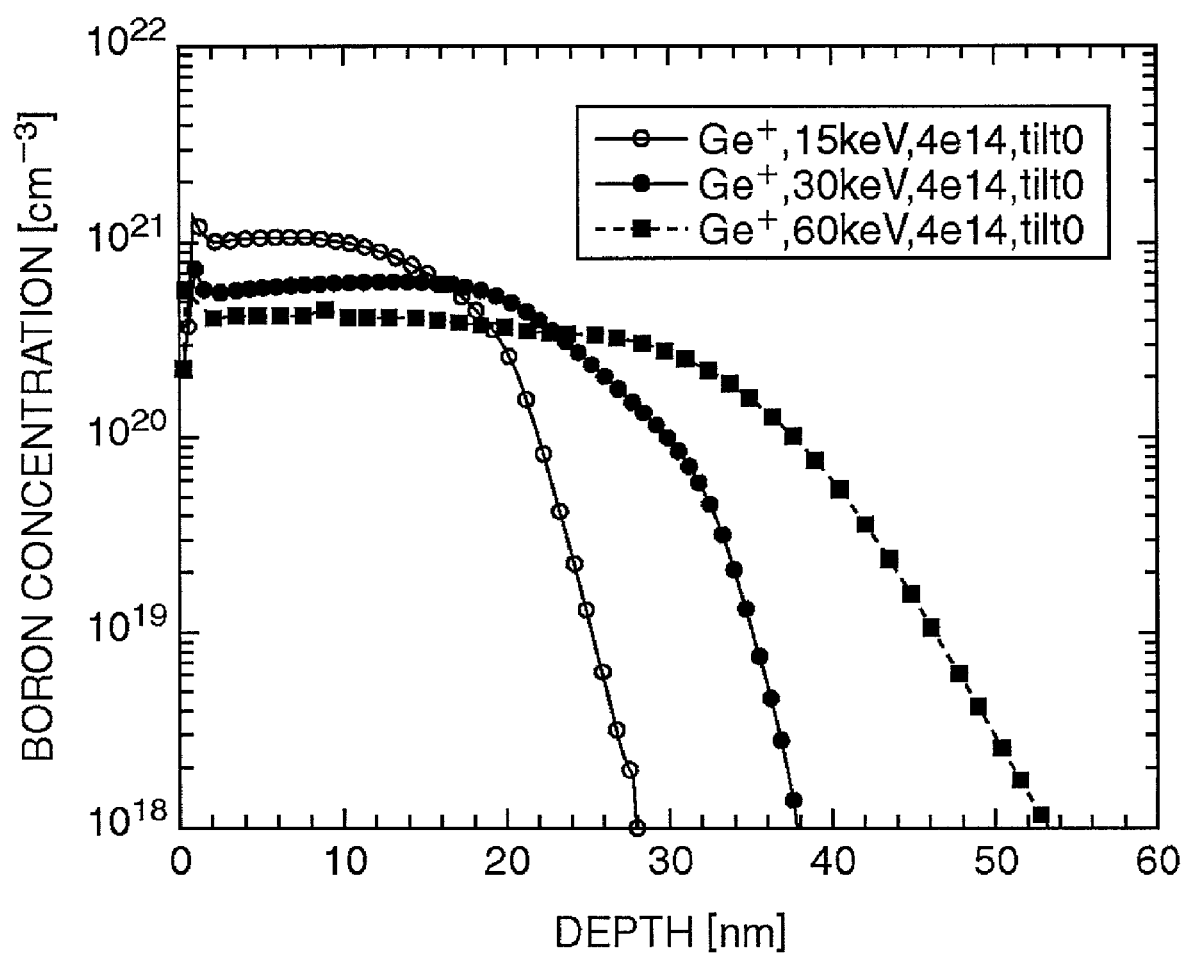
FIG. 2 is a characteristic diagram showing results of secondary ion mass spectrometry of samples to which Ge implantation and B implantation are executed and then laser annealing is performed.

FIG. 2 shows results of secondary ion mass spectrometry of samples to which the Ge implantation and the B implantation are executed and then the laser annealing is performed.

The ion implantation of atoms having a large mass such as Ge, Si and As amorphizes the Si substrate. The region which has been amorphized has a melting point lower than that of the single crystal region. Therefore, a region to be melted by the laser irradiation can be controlled by selecting the laser irradiation condition, adjusting the depth of the amorphous region by selecting acceleration energy for the ion implantation here, and by selecting the laser irradiation condition to melt the amorphous region and not to melt the single crystal region.

FIG. 2 shows the results of the samples of which the depths of the amorphous regions are varied by changing the acceleration energy at the time of Ge implanting. The implantation of heavy atoms in an oblique direction also enables control of the region to be melted in the horizontal direction. This technique is employed at the time of implanting impurities after the formation of the gate electrode, which enables control of the amorphous region which seeps into under the gate electrode. Before or after the step of ion implanting the heavy atoms, impurities for forming a pn junction are ion implanted and the laser annealing is performed thereon, which makes it possible to control the amount of overlap between the impurity extension region and the gate.

Further, when this technique is combined with the process of fabricating a MOS transistor having a metal (Al, Cu or the like) gate electrode, there is an advantage that the metal gate electrode is not susceptible to a damage by the ion implantation of heavy atoms as compared to a polysilicon gate electrode.

Furthermore, when a combination of a gate insulating film composed of a high-dielectric insulating film such as tantalum oxide and a metal gate electrode is employed, only the source and the drain which actually need to be heat treated can be selectively heat treated while the gate insulating film is not influenced by heat in the laser annealing process. Therefore, it is possible to improve compatibility with the MOS transistor process of the high-dielectric insulating film which dislikes a heat treatment at high temperatures.

Figure 3:
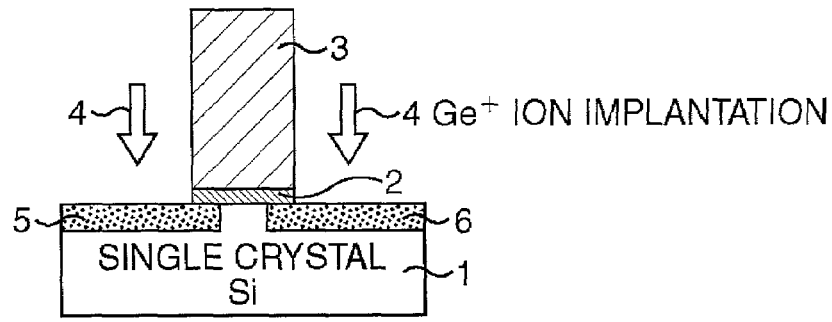
FIG. 3 is a schematic cross-sectional view illustrating manufacturing process of a MOS transistor for explaining another main configuration of the present invention.

Moreover, instead of implanting into the Si surface of the substrate 1 from the oblique directions the atoms having properties just enough to amorphize the single crystal Si as described above, the atoms are vertically implanted into the Si surface as in the normal case as shown in FIG. 3. In this case it is also possible to form a source and a drain 6 having parts corresponding to the amorphous regions 5 which seep into the substrate 1 under the gate electrode 3 by controlling a condition of introducing the atoms ($Ge^+$) and a condition of intensity of the laser irradiation respectively.

Figure 4:
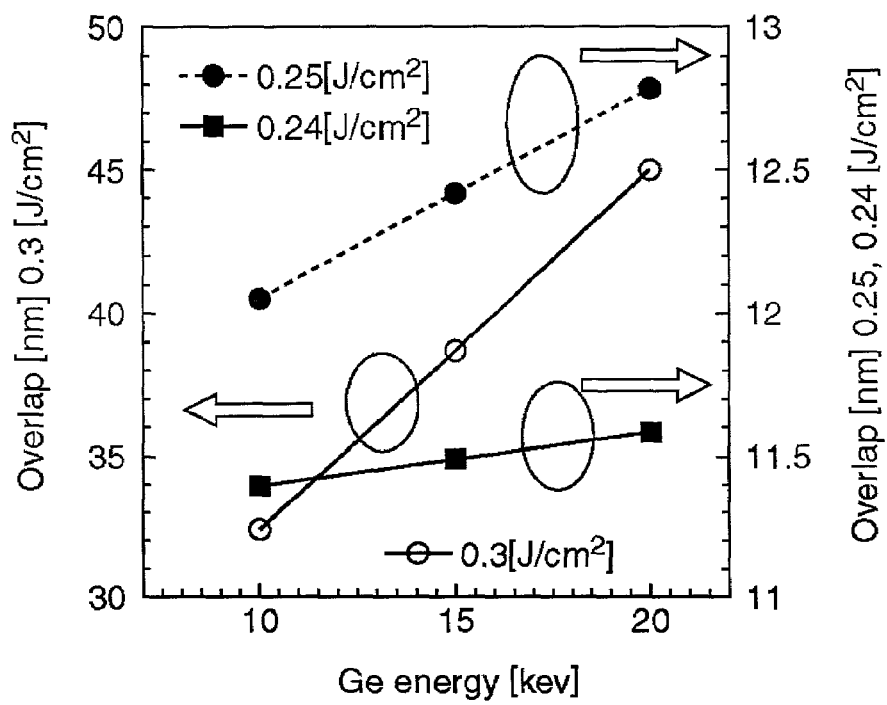
FIG. 4 is a characteristic diagram showing the relationship between the laser power and the overlapping length between a lower part of a gate electrode, and a source and a drain.

In other words, in this case, the fact is utilized that the substrate becomes amorphous by implanting the atoms having a large mass such as Ge, Si and As and the region which has become amorphous has a melting point lower than that of the single crystal region as described above. The condition of introducing the atoms shall be a condition enough for the amorphous regions to seep into the substrate 1 under the gate electrode 3 by adjusting the depth of the amorphous regions, and the condition of intensity of the laser irradiation shall be a condition that the amorphous regions melt but the single crystal region does not melt. This enables control of the regions to be melted by the laser irradiation. In this event, not only extension of dopant such as $B^+$ in the depth direction changes as in FIG. 2 but also extension of dopant seeping into under the gate electrode 3 changes (FIG. 4 shows the overlapping length between a lower part of the gate electrode 3 and the source and the drain 6 in FIG. 2). The extension can also be controlled by the intensity of the laser irradiation. More specifically, by adjusting the ion implantation energy of the heavy atoms, the extension of the amorphous regions can be adjusted not only in the depth direction but also in the horizontal direction. Therefore, it becomes possible to control the extension in the horizontal direction of the dopant into under the gate electrode 3 by the combination with the adjustment of the intensity of the laser irradiation.

Concrete Embodiments

Hereafter, concrete embodiments of a method of manufacturing a MOS transistor to which the present invention is applied will be described.

First Embodiment

First, the first embodiment is explained in order of step using FIGS. 5A to 5E and FIGS. 6A to 6C.

Figure 5A:
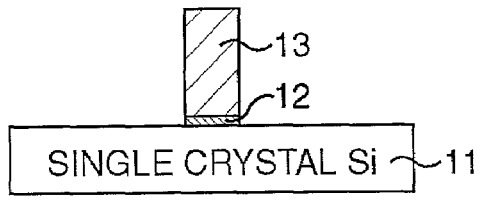
FIGS. 5A to 5E are schematic cross-sectional views illustrating in order of step a method of manufacturing a MOS transistor according to a first embodiment of the present invention.

(1) From Element Isolation to Gate Electrode Formation (FIG. 5A)

First, on a semiconductor substrate 11 made of single crystal Si, normal process of manufacturing a MOS transistor is executed which includes the formation of a not shown element isolation structure for defining an element region (a field oxide film by the LOCOS method, a local insulating film by the STI method and so on), the formation of a well structure by ion implantation of impurities, ion implantation for controlling the threshold value and so on.

Then, a gate insulating film 12 is formed on the defined element region of the semiconductor substrate 11. This gate insulating film is of one type selected from among a silicon oxide film, a silicon nitride film, a silicon oxynitride film and a metal oxide film having a dielectric constant higher than that of the silicon oxide film, or of a film having a laminated structure thereof.

Subsequently, a gate electrode material, one type selected from among polysilicon, poly-germanium, polysilicon-germanium, and metals such as Al, Cu and so on here is deposited on the gate insulating film 12. The electrode material and the gate insulating film 12 are patterned by photolithography and subsequent dry etching to form a gate electrode 13 (and the gate insulating film 12 processed in the shape following it).

Figure 5B:
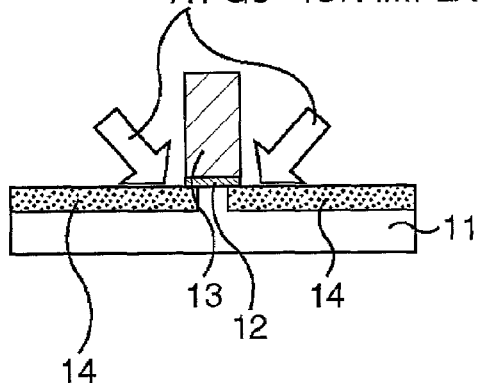

(2) Formation of First Amorphous Regions by Ion Implantation Using Heavy Atoms (FIG. 5B)

Atoms having properties just enough to amorphize single crystal Si are ion implanted (shown by arrows A1) from oblique directions to a surface layer of the element region of the semiconductor substrate 11 with the gate electrode 13 as a mask. As the atoms, one element selected from among Si, Ge, As and Ar is preferable. The atoms here shall be $Ge^+$, and the implantation conditions shall be 15 keV of acceleration energy and $4 \times 10^{14}/cm^2$ of dose. Further, the directions of the ion implantation shall be tilt 20 with an angle x° from a direction vertical to the surface of the semiconductor substrate 11 being defined as tilt x (i.e., the vertical direction is tilt 0). The single crystal Si is melted and re-crystallized by this ion implantation to form first amorphous regions 14 such as to seep into the substrate 11 under the gate electrode 13.

Figure 5C:
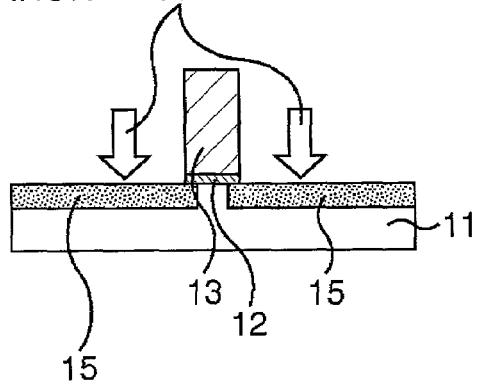

(3) Formation of Shallow pn Junctions (FIG. 5C) Subsequently, impurities having a conductive type opposite to that of the semiconductor substrate 11 are ion implanted (shown by arrows A2) into the surface layer of the element region with the gate electrode 13 as a mask. For example, if the MOS transistor to be manufactured is a PMOS as shown in FIG. 5C, $B^+$ ions are implanted under conditions of 0.5 keV of acceleration energy and $1 \times 10^{16}/cm^2$ of dose, and if the MOS transistor to be manufactured is an NMOS, $P^+$ ions are implanted under conditions of 2 keV of acceleration energy and $1 \times 10^{16}/cm^2$ of dose, so as to form shallow pn junction regions 15.

Figure 5D:
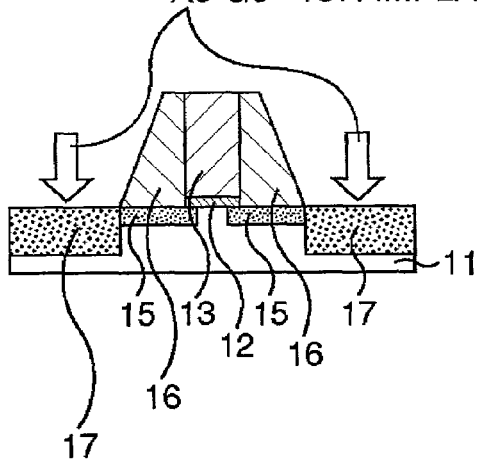

(4) Formation of Second Amorphous Regions by Ion Implantation Using Heavy Atoms (FIG. 5D)

Subsequently, an insulating film such as a silicon oxide film, a silicon nitride film or the like is formed by deposition on the entire surface of the substrate. Thereafter the entire surface of this insulating film is subjected to anisotropic etching (etch back) to thereby form side walls 16 with the insulating film left only on the side surfaces of the gate electrode 13.

Subsequently, atoms having properties just enough to amorphize single crystal Si, $Ge^+$ here, are ion implanted (shown by arrows A3) into the surface layers of the element regions with the gate electrode 13 and the side walls 16 as a mask to form second amorphous regions 17. In this event, the implantation conditions shall be conditions for amorphousizing the regions deeper than at time of forming the first amorphous regions 14, for example, 60 keV of acceleration energy and $4\times10^{14}/cm^2$ of dose.

Figure 5E:
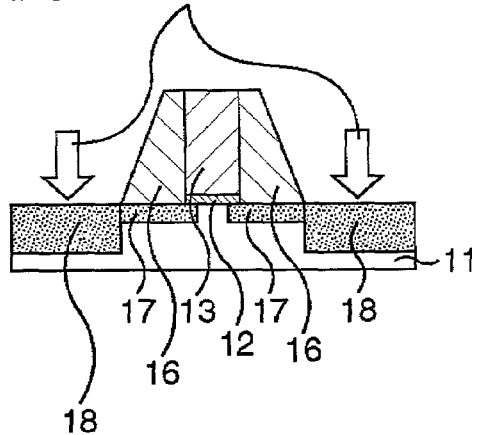

(5) Formation of Deep pn Junctions (FIG. 5E)

Subsequently, impurities having a conductive type opposite to that of the semiconductor substrate 11 are ion implanted (shown by arrows A4) into the surface layers of the element regions with the gate electrode 13 and the side walls 16 as a mask. In this event, the implantation conditions shall be conditions for extending the impurities deeper than at the time of forming the shallow pn junction regions 15. For example, if the MOS transistor to be manufactured is a PMOS as shown in FIG. 5E, $B^+$ ions are implanted under conditions of 5 keV of acceleration energy and $1\times10^{16}/cm^2$ of dose, and if the MOS transistor to be manufactured is an NMOS, $P^+$ ions are implanted under conditions of 15 keV of acceleration energy and $1\times10^{16}/cm^2$ of dose, so as to form deep pn junction regions 18 which are superposed on the shallow pn junction regions 15.

Figure 6A:
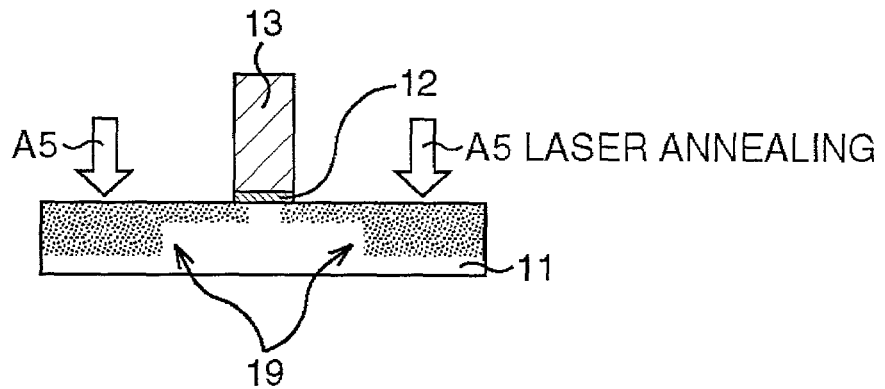
FIGS. 6A to 6C are schematic cross-sectional views illustrating in order of step the method of manufacturing the MOS transistor subsequent to FIG. 5E according to the embodiment of the present invention.

(6) Laser Annealing (FIG. 6A)

Subsequently, the side walls 16 are removed by wet etching using hydrofluoric acid, and thereafter the substrate surface is irradiated with excimer pulse laser of XeCl, ArF or the like one or a plural times (shown by arrows A5) to activate the impurities in the pn junction regions 15 and 18, so as to form a source and a drain 19 corresponding to the pn junction regions 15 and 18.

As described above, in this example, the source and the drain 19 of an LDD structure composed of two types of junction regions can be activated in one laser annealing step. The formed a source and a drain 19 have a capacitance on the source side of 0.25 (fF/μm/side) or more. This capacitance is an index showing the amount of overlap between the source and the drain and the gate electrode. The capacitance is about 0.20 fF/μm in the conventional MOS transistor using the laser annealing method, but a capacitance of 0.25 (fF/μm/side) or more is secured in this embodiment, and thus it is conceivable that enough overlap is obtained.

Figure 6B:
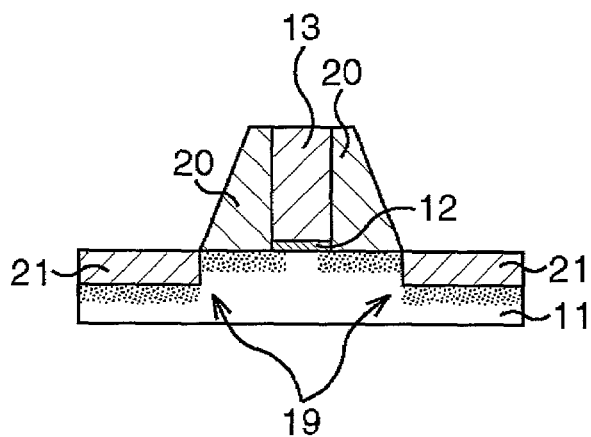
Figure 6C:
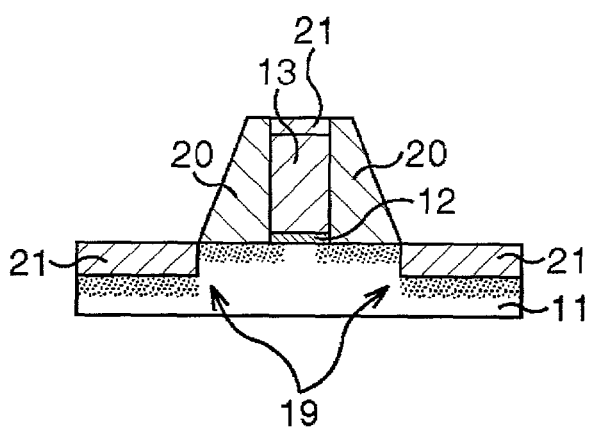

(7) Silicidation (Salicidation) (FIG. 6B or FIG. 6C)

First, an insulating film such as a silicon oxide film, a silicon nitride film or the like is formed by deposition on the entire surface of the substrate. Thereafter the entire surface of this insulating film is subjected to anisotropic etching (etch back) to thereby form again side walls 20 with the insulating film left only on the side surfaces of the gate electrode 13.

Subsequently, as shown in FIG. 6B, when the gate electrode 13 is a metal gate made of a metal material such as Al, Cu or the like, a metal film such as Ti, Pt, Co, Ni or the like is formed on the source and the drain 19 by the sputtering method or the like and is subjected to an annealing treatment as a siliciding process to form metal silicide films 21.

On the other hand, as shown in FIG. 6C, when the gate electrode 13 is made of polysilicon or the like, a metal film such as Ti, Pt, Co, Ni or the like is formed on the gate electrode 13 and the source and the drain 19 by the sputtering method or the like and is subjected to an annealing treatment as a siliciding process to form metal silicide films 21.

The source and the drain 19 which have been activated and formed by the laser annealing have good compatibility with the siliciding (saliciding) process because of their box-shape impurity profiles which are activated to have a high impurity concentration.

Thereafter, through the following process such as the formation of a not shown interlayer insulating film, a contact hole and each wiring layer, the MOS transistor is completed.

As described above, according to this embodiment, it becomes possible to obtain a sharp impurity profile through the use of the laser annealing method without presenting a disadvantage such as an increase in parasitic resistance or the like to thereby meet sufficiently the requirements for making a MOS transistor finer and more highly integrated.

It should be noted that the MOS transistor is illustrated as a semiconductor device, in which the main configuration of the present invention is applied to the laser annealing treatment in forming the source and the drain of the LDD structure in this embodiment. The present invention, however, is not limited to this, but is also preferably applied to, for example, the case in which three times or more of impurity ion implantation are required under different introduction conditions, heavy atom ion implantation is performed for amorphousization in correspondence with each impurity ion implantation, and the impurities are activated in one laser annealing treatment.

Second Embodiment

Next, the second embodiment is explained in order of step using FIGS. 7A to 7D.

Figure 7A:
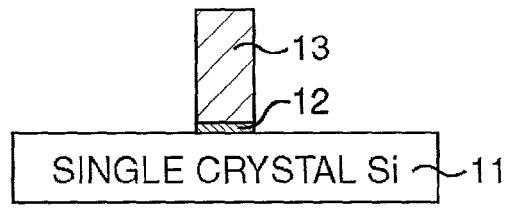
FIGS. 7A to 7D are schematic cross-sectional views illustrating in order of step a method of manufacturing a MOS transistor according to a second embodiment of the present invention.

(1) From Element Isolation to Gate Electrode Formation (FIG. 7A)

First, on a semiconductor substrate 11 made of single crystal Si, normal process of manufacturing a MOS transistor is executed which includes the formation of a not shown element isolation structure for defining an element region (a field oxide film by the LOCOS method, a local insulating film by the STI method and so on), the formation of a well structure by ion implantation of impurities, ion implantation for controlling the threshold value and so on.

Then, a gate insulating film 12 is formed on the defined element region of the semiconductor substrate 11. This gate insulating film is of one type selected from among a silicon oxide film, a silicon nitride film, a silicon oxynitride film and a metal oxide film having a dielectric constant higher than that of the silicon oxide film, or of a film having a laminated structure thereof.

Subsequently, a gate electrode material, one type selected from among polysilicon, poly-germanium, polysilicon-germanium, and metals such as Al, Cu and so on here is deposited on the gate insulating film 12. The electrode material and the gate insulating film 12 are patterned by photolithography and subsequent dry etching to form a gate electrode 13 (and the gate insulating film 12 processed in the shape following it).

Figure 7B:
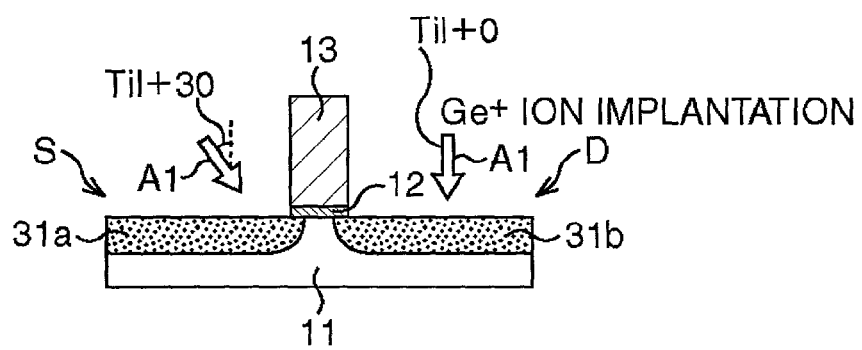

(2) Formation of Amorphous Regions by Ion Implantation Using Heavy Atoms (FIG. 7B)

Atoms having properties just enough to amorphize single crystal Si are ion implanted (shown by arrows A1) from oblique directions to surface layer of the element region of the substrate 11 with the gate electrode 13 as a mask. As the atoms, one element selected from among Si, Ge, As and Ar is preferable. The atoms here shall be $Ge^+$, and the implantation conditions shall be 15 keV of acceleration energy and $4\times10^{14}/cm^2$ of dose.

In this embodiment, the tilt angles of the introduction of atoms with respect to a direction vertical to the surface of the semiconductor substrate 11 are controlled so as to be greater on the source side S than on the drain side D. Thereby, the amorphous regions are formed such that the amount of seeping into the semiconductor substrate 11 under the gate electrode 13 is greater on the source side S than on the drain side D. Specifically, the directions of the ion implantation shall be tilt 0 on the drain side D and tilt 30 on the source side S with an angle x° from the direction vertical to the surface of the semiconductor substrate 11 being defined as tilt x (i.e., the vertical direction is tilt 0). By this ion implantation, the single crystal Si on the drain side D is melted and re-crystallized to form an amorphous region 31b such as to seep into the substrate 11 under the gate electrode 13. On the source side S, an amorphous region 31a is formed which has an amount of seeping greater than that of the amorphous region 31b.

Figure 7C:
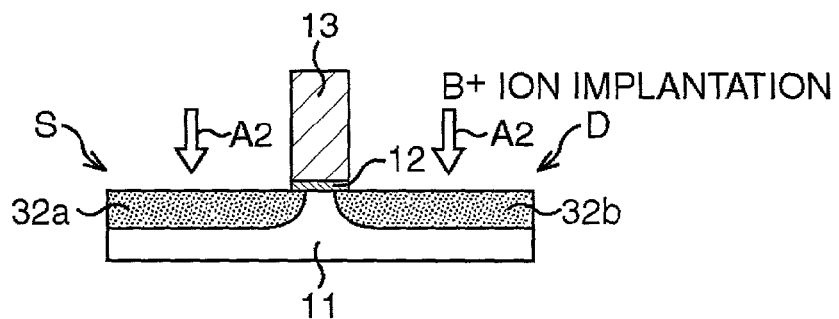

(3) Formation of a Source and a Drain (FIG. 7C)

Subsequently, impurities having a conductive type opposite to that of the semiconductor substrate 11 are ion implanted (shown by arrows A2) into the surface layer of the element region with the gate electrode 13 as a mask. For example, if the MOS transistor to be manufactured is a PMOS as shown in FIG. 7C, $B^+$ ions are implanted under conditions of 0.5 keV of acceleration energy and $1\times10^{16}/cm^2$ of dose, and if the MOS transistor to be manufactured is an NMOS, $As^+$ ions are implanted under conditions of 2 keV of acceleration energy and $1\times10^{16}/cm^2$ of dose, so as to form a pn junction region 32b on the drain side D and a pn junction region 32a on the source side S.

Figure 7D:
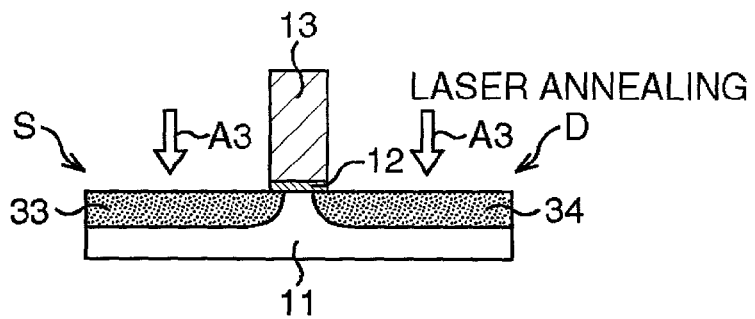

(4) Laser Annealing (FIG. 7D)

First, a heat absorbing film is formed to cover the gate electrode 13. This heat absorbing film is constituted by forming a silicon oxide film 33a by the CVD method to have a film thickness of 5 nm to 50 nm and further forming a TaN film 33b by the sputtering method to have a film thickness of 20 nm to 40 nm.

Subsequently, the substrate surface is irradiated with excimer pulse laser of XeCl, ArF or the like, or laser beams using YAG laser or the like one or a plural times (shown by arrows A3) to activate the impurities in the pn junction regions 32a and 32b, so as to form a source 33 and a drain 34 corresponding to the pn junction regions 32a and 32b. In this case, the laser power is selected from a range from 0.1 ($J/cm^2$) to 0.4 ($J/cm^2$).

As described above, in this embodiment, the amorphous regions 31 seeping into under the gate electrode 13 are controlled to be greater on the source side than that on the drain side. This makes it possible to make large the amount of overlap on the source side having great effect of suppressing parasitic resistance and to make small the amount of overlap on the drain side for suppressing the short channel effect.

As for the source 33 and the drain 34, the capacitance on the source side is 0.25 (fF/μm/side) or more. This capacitance is an index showing the amount of overlap between the source and the drain and the gate electrode. The capacitance is about 0.20 fF/μm in the conventional MOS transistor using the laser annealing method, but a capacitance of 0.25 (fF/μm/side) or more is secured in this embodiment, and thus it is conceivable that enough overlap is obtained.

As described above, according to this embodiment, it becomes possible to obtain a sharp impurity profile through the use of the laser annealing method without presenting a disadvantage such as an increase in parasitic resistance or the like to thereby meet sufficiently the requirements for making a MOS transistor finer and more highly integrated.

Third Embodiment

Next, the third embodiment is explained in order of step using FIGS. 8A to 8D.

Figure 8A:
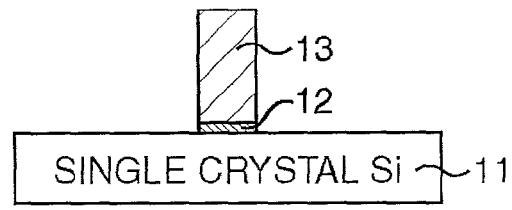
FIGS. 8A to 8D are schematic cross-sectional views illustrating in order of step a method of manufacturing a MOS transistor according to a third embodiment of the present invention.

(1) From Element Isolation to Gate Electrode Formation (FIG. 8A)

First, on a semiconductor substrate 11 made of single crystal Si, normal process of manufacturing a MOS transistor is executed which includes the formation of a not shown element isolation structure for defining an element region (a field oxide film by the LOCOS method, a local insulating film by the STI method and so on), the formation of a well structure by ion implantation of impurities, ion implantation for controlling the threshold value and so on.

Then, a gate insulating film 12 is formed on the defined element region of the semiconductor substrate 11. This gate insulating film is of one type selected from among a silicon oxide film, a silicon nitride film, a silicon oxynitride film and a metal oxide film having a dielectric constant higher than that of the silicon oxide film, or of a film having a laminated structure thereof.

Subsequently, a gate electrode material, one type selected from among polysilicon, poly-germanium, polysilicon-germanium, and metals such as Al, Cu and so on here is deposited on the gate insulating film 12. The electrode material and the gate insulating film 12 are patterned by photolithography and subsequent dry etching to form a gate electrode 13 (and the gate insulating film 12 processed in the shape following it).

Figure 8B:
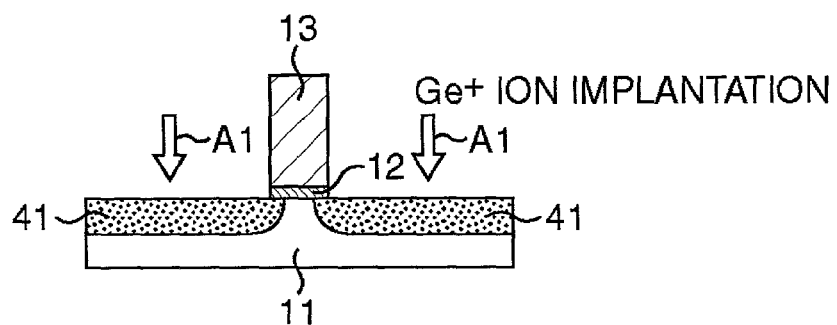

(2) Formation of Amorphous Regions by Ion Implantation Using Heavy Atoms (FIG. 8B)

Atoms having properties just enough to amorphize single crystal Si are ion implanted (shown by arrows A1) from oblique directions to a surface layer of the element region of the substrate 11 with the gate electrode 13 as a mask. The ion implantation is controlled so that the extension length in the depth direction is 20 nm to 60 nm and the extension length in the horizontal direction is 10 nm to 30 nm to form amorphous regions 41. As the atoms, one element selected from among Si, Ge, As and Ar is preferable. The atoms here shall be $Ge^+$, and the implantation conditions shall be 15 keV of acceleration energy and $4\times10^{14}/cm^2$ of dose.

Figure 8C:
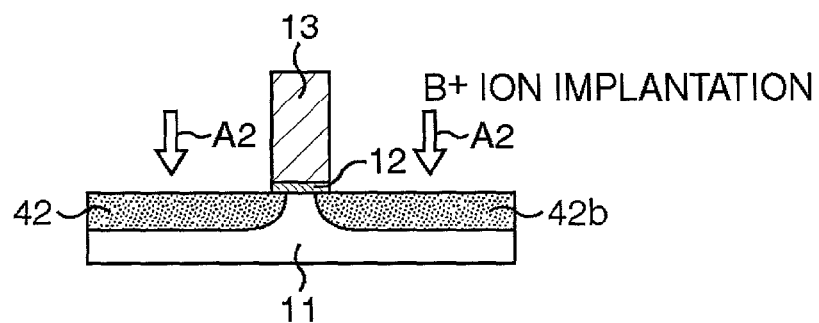

(3) Formation of a Source and a Drain (FIG. 8C)

Subsequently, impurities having a conductive type opposite to that of the semiconductor substrate 11 are ion implanted (shown by arrows A2) into the surface layer of the element region with the gate electrode 13 as a mask. For example, if the MOS transistor to be manufactured is a PMOS as shown in FIG. 8C, $B^+$ ions are implanted under conditions of 0.5 keV of acceleration energy and $1\times10^{16}/cm^2$ of dose, and if the MOS transistor to be manufactured is an NMOS, $As^+$ ions are implanted under conditions of 5 keV of acceleration energy and $1\times10^{16}/cm^2$ of dose, so as to form pn junction regions 42.

Figure 8D:
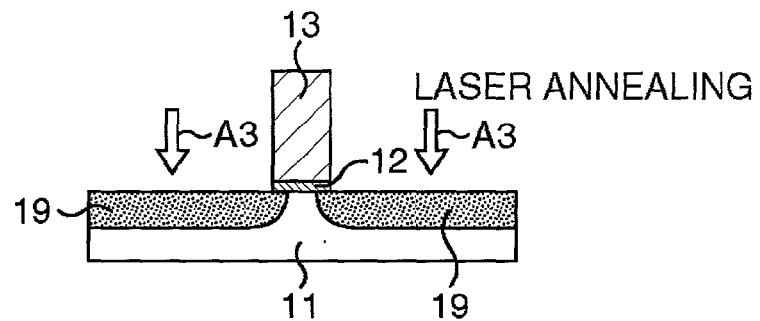

(4) Laser Annealing (FIG. 8D)

First, a heat absorbing film is formed to cover the gate electrode 13. The heat absorbing film is constituted by forming a silicon oxide film 33a by the CVD method to have a film thickness of 5 nm to 50 nm and further forming a TaN film 33b by the sputtering method to have a film thickness of 20 nm to 40 nm.

Subsequently, the substrate surface is irradiated with excimer pulse laser of XeCl, ArF or the like, or laser beams using YAG laser or the like one or a plural times (shown by arrows A3) to activate the impurities in the pn junction regions 42, so as to form a source and a drain 19 corresponding to the pn junction regions 42. In this case, the laser power is selected from a range from 0.1 ($J/cm^2$) to 0.4 ($J/cm^2$).

As described above, in this example, the formed a source and a drain 19 have a capacitance on the source side of 0.25 (fF/μm/side) or more. This capacitance is an index showing the amount of overlap between the source and the drain and the gate electrode. The capacitance is about 0.20 (fF/μm/side) in the conventional MOS transistor using the laser annealing method, but a capacitance of 0.25 (fF/μm/side) or more is secured in this embodiment, and thus it is conceivable that enough overlap is obtained.

As described above, according to this embodiment, it becomes possible to obtain a sharp impurity profile through the use of the laser annealing method without presenting a disadvantage such as an increase in parasitic resistance or the like to thereby meet sufficiently the requirements for making a MOS transistor finer and more highly integrated.

Modified Examples

Modified examples of the third embodiment are explained here. These modified examples illustrate CMOS transistors of an LDD structure.

Modified Example 1

First, the modified example 1 is explained in order of step using FIGS. 9A to 9E.

Figure 9A:
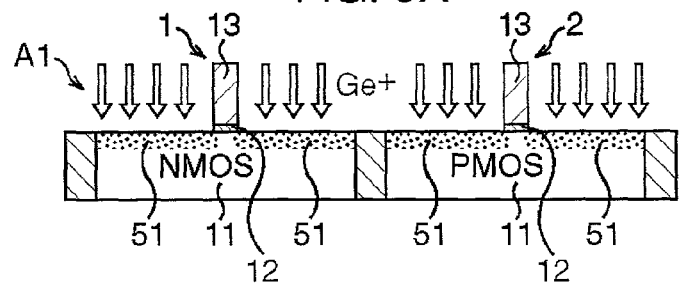
FIGS. 9A to 9E are schematic cross-sectional views illustrating in order of step a manufacturing method of a modified example 1 of a MOS transistor according to the third embodiment of the present invention.

(1) From Element Isolation to Formation of Gate Electrodes and Deep pn Junctions (FIG. 9A)

First, on a semiconductor substrate 11 made of single crystal Si, normal process of manufacturing a MOS transistor is executed which includes the formation of not shown element isolation structures for defining element regions (a field oxide film by the LOCOS method, a local insulating film by the STI method and so on), the formation of well structures by ion implantation of impurities, ion implantation for controlling the threshold value and so on.

Then, a gate insulating film 12 is formed on the defined element regions of the semiconductor substrate 11. This gate insulating film is of one type selected from among a silicon oxide film, a silicon nitride film, a silicon oxynitride film and a metal oxide film having a dielectric constant higher than that of the silicon oxide film, or of a film having a laminated structure thereof.

Subsequently, a gate electrode material, one type selected from among polysilicon, poly-germanium, polysilicon-germanium, and metals such as Al, Cu and so on here is deposited on the gate insulating film 12. The electrode material and the gate insulating film 12 are patterned by photolithography and subsequent dry etching to form gate electrodes 13 (and the gate insulating films 12 processed in the shape following them).

(2) Formation of Shallow Amorphous Regions by Ion Implantation Using Heavy Atoms Atoms having properties just enough to amorphize single crystal Si are ion implanted (shown by arrows A1) into surface layers of the element regions of the substrate 11 with the gate electrodes 13 as a mask. The ion implantation is controlled so that the extension length in the depth direction is 20 nm to 60 nm and the extension length in the horizontal direction is 10 nm to 30 nm so as to form shallow amorphous regions 51. The impurity distribution after the later-described laser annealing step is determined by the extension of the shallow amorphous regions 51. This extension is determined by the aforesaid ion implantation conditions of the atoms as described above. As the atoms, one element selected from among Si, Ge, As and Ar is preferable. The atoms here shall be $Ge^+$, and the implantation conditions shall be 10 keV to 60 keV of acceleration energy and $4\times10^{14}/cm^2$ of dose.

Figure 9B:
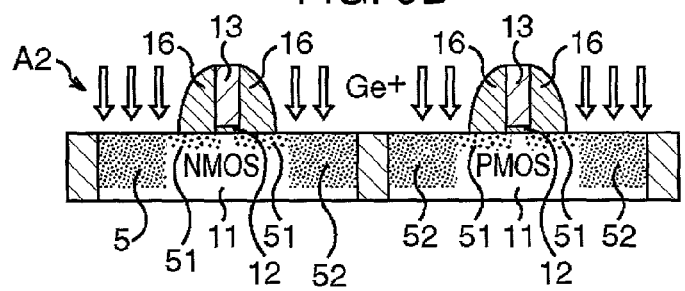

(3) Formation of Deep Amorphous Regions by Ion Implantation Using Heavy Atoms (FIG. 9B)

An insulating film such as a silicon oxide film, a silicon nitride film or the like is formed by deposition on the entire surface of the substrate. Thereafter the entire surface of this insulating film is subjected to anisotropic etching (etch back) to thereby form side walls 16 with the insulating film left only on the side surfaces of the gate electrodes 13.

Subsequently, atoms having properties just enough to amorphize single crystal Si are ion implanted (shown by arrows A2) into the surface layers of the element regions of the semiconductor substrate 11 with the gate electrodes 13 and the side walls 16 as a mask. The ion implantation is controlled so that the extension length in the depth direction is 50 nm to 70 nm so as to form deep amorphous regions 52 to be connected to the amorphous regions 51. The impurity distribution after the later-described laser annealing step is determined by the extension of the amorphous regions 52. This extension is determined by the ion implantation conditions of the aforesaid atoms as described above. As the atoms, one element selected from among Si, Ge, As and Ar is preferable. The atoms here shall be $Ge^+$, and the implantation conditions shall be 40 keV to 80 keV of acceleration energy and $4\times10^{14}/cm^2$ of dose.

Figure 9C:
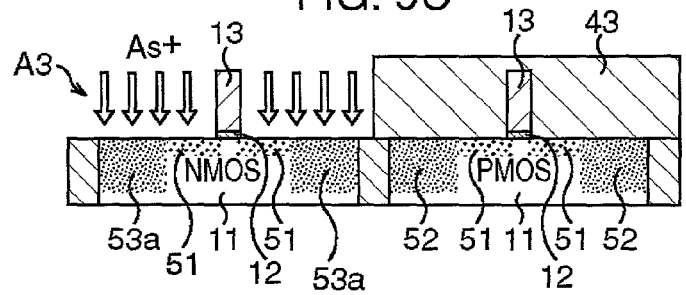
Figure 9D:
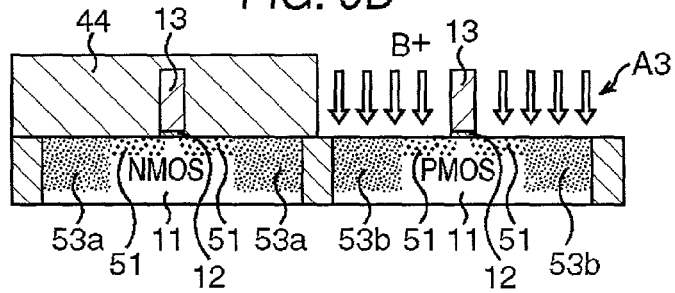

(4) Formation of pn Junctions (FIGS. 9C and 9D) After the side walls 16 are removed, impurities having a conductive type opposite to that of the semiconductor substrate 11 are ion implanted (shown by arrows A3) into the surface layers of the element regions with the gate electrodes 13 as a mask. For example, when ion implantation is executed to an NMOS region as shown in FIG. 9C, for example, $As^+$ ions are implanted under conditions of 2 keV of acceleration energy and $1\times10^{16}/cm^2$ of dose while a PMOS region is masked with a resist pattern 43. This forms n regions 53a which are pn junction regions. On the other hand, when ion implantation is executed to the PMOS region, for example, $B^+$ ions are implanted under conditions of 0.5 keV of acceleration energy and $1\times10^{16}/cm^2$ of dose while the NMOS region is masked with a resist pattern 44. This forms p regions 53b which are pn junction regions.

Figure 9E:
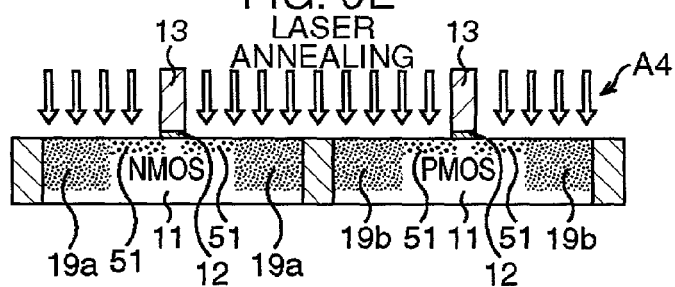

(5) Laser Annealing (FIG. 9E)

Subsequently, the substrate surface is irradiated with excimer pulse laser of XeCl, ArF or the like under conditions of 0.3 ($J/cm^2$) of laser power one or a plural times (shown by arrows A4) to activate the impurities in the pn junction regions 53a and 53b, so as to form a source and a drain (n a source and a drain 19a and p a source and a drain 19b) corresponding to the pn junction regions 53a and 53b.

As described above, in this example, the source and the drain 19a and 19b of an LDD structure composed of two types of junction regions can be activated in one laser annealing step. The formed a source and a drain 19a and 19b have a capacitance on the source side of 0.25 (fF/μm/side) or more. This capacitance is an index showing the amount of overlap between the source and the drain and the gate electrode. The capacitance is about 0.20 fF/μm in the conventional MOS transistor using the laser annealing method, but a capacitance of 0.25 (fF/μm/side) or more is secured in this embodiment, and thus it is conceivable that enough overlap is obtained.

It should be noted that thereafter side walls may be formed again on the side surfaces of the gate electrodes 13 and may be silicided (salicided).

Modified Example 2

Next, the modified example 2 is explained in order of step using FIGS. 10A to 10E.

Figure 10A:
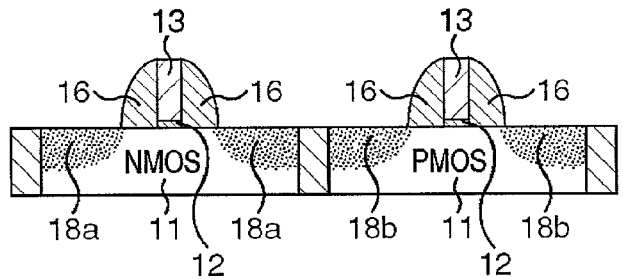
FIGS. 10A to 10E are schematic cross-sectional views illustrating in order of step a manufacturing method of a modified example 2 of a MOS transistor according to the third embodiment of the present invention.

(1) From Element Isolation to Formation of Gate Electrodes and Deep pn Junctions (FIG. 10A)

First, on a semiconductor substrate 11 made of single crystal Si, normal process of manufacturing a MOS transistor is executed which includes the formation of not shown element isolation structures for defining element regions (a field oxide film by the LOCOS method, a local insulating film by the STI method and so on), the formation of well structures by ion implantation of impurities, ion implantation for controlling the threshold value and so on.

Then, a gate insulating film 12 is formed on the defined element regions of the semiconductor substrate 11. This gate insulating film is of one type selected from among a silicon oxide film, a silicon nitride film, a silicon oxynitride film and a metal oxide film having a dielectric constant higher than that of the silicon oxide film, or of a film having a laminated structure thereof.

Subsequently, a gate electrode material, one type selected from among polysilicon, poly-germanium, polysilicon-germanium, and metals such as Al, Cu and so on here is deposited on the gate insulating film 12. The electrode material and the gate insulating film 12 are patterned by photolithography and subsequent dry etching to form gate electrodes 13 (and the gate insulating films 12 processed in the shape following them).

Subsequent, an insulating film such as a silicon oxide film, a silicon nitride film or the like is formed by deposition on the entire surface of the substrate. Thereafter the entire surface of this insulating film is subjected to anisotropic etching (etch back) to thereby form side walls 16 with the insulating film left only on the side surfaces of the gate electrodes 13.

Subsequently, impurities having a conductive type opposite to that of the semiconductor substrate 11 are ion implanted into the surface layers of the element regions with the gate electrodes 13 and the side walls 16 as a mask. In this case, as for the implantation conditions of the NMOS region, for example, As$^+$ ions are implanted under conditions of 25 keV of acceleration energy and $8\times10^{15}/cm^2$ of dose, or P$^+$ ions are implanted under conditions of 7 keV of acceleration energy and $8\times10^{15}/cm^2$ of dose. Then, an annealing treatment is performed for 10 minutes at a temperature of 100° C. to form deep pn junction regions 18 (n$^+$ regions 18a and p$^+$ regions 18b).

Figure 10B:
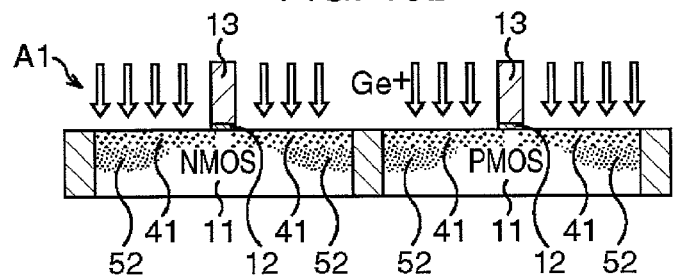

(2) Formation of Amorphous Regions by Ion Implantation Using Heavy Atoms (FIG. 10B)

After the side walls 16 are removed, atoms having properties just enough to amorphize single crystal Si are ion implanted (shown by arrows A1) into the surface layers of the element regions of the substrate 11 with the gate electrodes 13 as a mask. The ion implantation is controlled so that the extension length in the depth direction is 20 nm to 60 nm and the extension length in the horizontal direction is 10 nm to 30 nm so as to form amorphous regions 41. The impurity distribution after the later-described laser annealing step is determined by the extension of the shallow amorphous regions 41. This extension is determined by the aforesaid ion implantation conditions of the atoms as described above. As the atoms, one element selected from among Si, Ge, As and Ar is preferable. The atoms here shall be Ge$^+$, and the implantation conditions shall be 10 keV to 60 keV of acceleration energy and $4\times10^{14}/cm^2$ of dose.

Figure 10C:
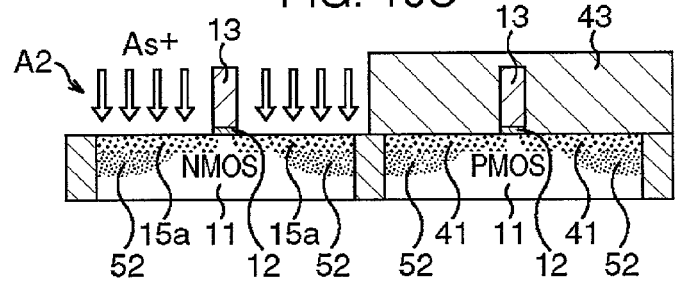
Figure 10D:
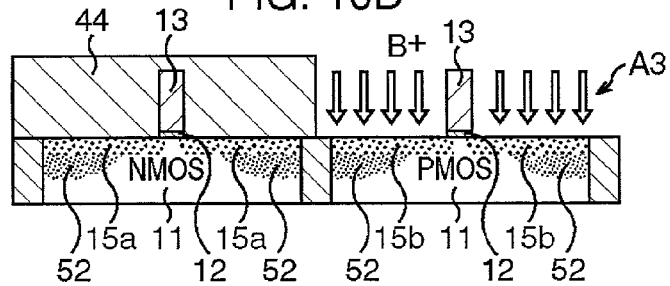

(3) Formation of Shallow pn Junctions (FIGS. 10C and 10D)

Subsequently, impurities having a conductive type opposite to that of the semiconductor substrate 11 are ion implanted (shown by arrows A2) into the surface layers of the element regions with the gate electrode 13 as a mask. For example, when ion implantation is executed to an NMOS region as shown in FIG. 10C, for example, As$^+$ ions are implanted under conditions of 2 keV of acceleration energy and $1\times10^{16}/cm^2$ of dose while a PMOS region is masked with a resist pattern 43. This forms n regions 15a which are shallow pn junction regions. On the other hand, when ion implantation is executed to the PMOS region, for example, B$^+$ ions are implanted under conditions of 0.5 keV of acceleration energy and $1\times10^{16}/cm^2$ of dose while the NMOS region is masked with a resist pattern 44. This forms p regions 15b which are shallow pn junction regions.

Figure 10E:
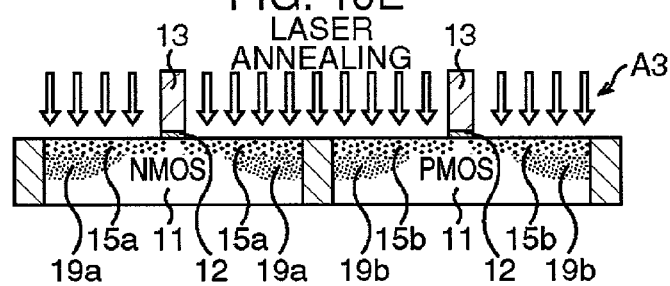

(4) Laser Annealing (FIG. 10E)

Subsequently, the substrate surface is irradiated with excimer pulse laser of XeCl, ArF or the like under conditions of, for example, 0.3 (J/cm$^2$) of laser power one or a plural times (shown by arrows A3) to activate the impurities in the pn junction regions 15 and 18, so as to form a source and a drain (n a source and a drain 19a and p a source and a drain 19b) corresponding to the pn junction regions 15 and 18.

As described above, in this example, the source and the drain 19a and 19b of an LDD structure composed of two types of junction regions can be activated in one laser annealing step. The formed a source and a drain 19a and 19b have a capacitance on the source side of 0.25 (fF/μm/side) or more. This capacitance is an index showing the amount of overlap between the source and the drain and the gate electrode. The capacitance is about 0.20 (fF/μm/side) in the conventional MOS transistor using the laser annealing method, but a capacitance of 0.25 (fF/μm/side) or more is secured in this embodiment, and thus it is conceivable that enough overlap is obtained.

It should be noted that thereafter side walls may be formed again on the side surfaces of the gate electrodes 13 and may be silicided (salicided).

Further, in the above-described second embodiment, a CMOS transistor of an LDD structure can be manufactured as in this modified example.

It becomes possible to obtain a sharp impurity profile through the use of the laser annealing method without presenting a disadvantage such as an increase in parasitic resistance or the like to thereby meet sufficiently the requirements for making a MOS transistor finer and more highly integrated.

What is claimed is:

1. A method of manufacturing a semiconductor device having a gate, a source and a drain within a single crystal semiconductor region, comprising:

a first step of pattern forming said gate above said single crystal semiconductor region through a gate insulating film;

a second step of introducing atoms to amorphize said single crystal semiconductor from oblique directions to a surface of said single crystal semiconductor region with said gate as a mask to form amorphous regions seeping into said single crystal semiconductor region under said gate;

before or after said second step, a third step of introducing impurities into said amorphous regions of said single crystal semiconductor region with said gate as a mask; and a fourth step of activating said impurities by executing laser irradiation on at least said amorphous regions to form the source and the drain;

wherein an intensity of said laser irradiation is a value of conditions under which said amorphous semiconductor melts but said single semiconductor does not melt.

2. The method of manufacturing a semiconductor device according to claim 1, further comprising:

after said fourth step, a fifth step of forming a side wall insulating film on side surfaces of said gate and siliciding surface layers of the source and the drain with said gate and said side wall insulating film as a mask.

3. The method of manufacturing a semiconductor device according to claim 1, wherein
said gate insulating film is of one type selected from among a silicon oxide film, a silicon nitride film, a silicon oxynitride film and a metal oxide film having a dielectric constant higher than that of the silicon oxide film, or of a film having a laminated structure thereof.

4. The method of manufacturing a semiconductor device according to claim 1, wherein
a material of said gate is of one element selected from among silicon, germanium, silicon-germanium and metals.

5. The method of manufacturing a semiconductor device according to claim 1, wherein
said atoms to amorphize said single crystal semiconductor are of one element selected from among Si, Ge, As and Ar.

6. A method of manufacturing a semiconductor device having a gate, a source and a drain within a single crystal semiconductor region, comprising:
a first step of pattern forming said gate above said single crystal semiconductor region through a gate insulating film;
a second step of introducing atoms to amorphize said single crystal semiconductor from oblique directions to a surface of said single crystal semiconductor region with said gate as a mask to form first amorphous regions seeping into said single crystal semiconductor region under said gate;
before or after said second step, a third step of introducing impurities into said first amorphous regions of said single crystal semiconductor region with said gate as a mask to form first junction regions;
a fourth step of forming a side wall insulating film on side surfaces of said gate;
a fifth step of introducing atoms to amorphize said single crystal semiconductor into the surface of said single crystal semiconductor region with said gate and said side wall insulating film as a mask to form second amorphous regions which are deeper than said first amorphous regions;
before or after said fifth step, a sixth step of introducing impurities into said second amorphous regions of said single crystal semiconductor region with said gate and said side wall insulating film as a mask to form second junction regions which are deeper than said first junction regions; and
a seventh step of removing said side wall insulating film and thereafter activating said impurities in said first and second junction regions by executing laser irradiation on at least said amorphous regions to form the source and the drain;
wherein an intensity of said laser irradiation is a value of conditions under which said amorphous semiconductor melts but said single semiconductor does not melt.

7. The method of manufacturing a semiconductor device according to claim 6, further comprising:
after said seventh step, an eighth step of forming again a side wall insulating film on the side surfaces of said gate and siliciding surface layers of the source and the drain with said gate and said side wall insulating film as a mask.

8. A method of manufacturing a semiconductor device, comprising the steps of:
introducing atoms to amorphize a single crystal semiconductor using a mask at least twice under different introduction conditions to form each amorphous region having a different depth and area in accordance with each introduction of said atoms;
introducing impurities into said each amorphous region for forming a pn junction before or after each introduction of said atoms; and
activating said introduced impurities by executing laser irradiation on at least said amorphous regions to form said pn junction;
wherein an intensity of said laser irradiation is a value of conditions under which said amorphous semiconductor melts but said single semiconductor does not melt.

9. The method of manufacturing a semiconductor device according to claim 8, wherein
at the occasion of the introduction of said atoms, said atoms are introduced from an oblique direction to a surface of said single crystal semiconductor region to seep into said single crystal semiconductor region under said mask at least at one time of introduction of said atoms.

10. The method of manufacturing a semiconductor device according to claim 8, wherein
said atoms to amorphize said single crystal semiconductor are of one element selected from among Si, Ge, As and Ar.

11. A method of manufacturing a semiconductor device having a gate, a source and a drain within a single crystal semiconductor region, comprising:
a first step of pattern forming said gate above said single crystal semiconductor region through a gate insulating film;
a second step of introducing atoms to amorphize said single crystal semiconductor into a surface of said single crystal semiconductor region with said gate as a mask to form amorphous regions;
before or after said second step, a third step of introducing impurities into said amorphous regions of said single crystal semiconductor region with said gate as a mask; and
a fourth step of activating said impurities by executing laser irradiation on at least said amorphous regions to form the source and the drain,
wherein conditions of introducing said atoms in said second step and conditions of intensity of the laser irradiation in said fourth step are controlled respectively to form parts of the source and the drain corresponding to said amorphous regions to seep into said single crystal semiconductor region under said gate; and
wherein the conditions of introducing said atoms are conditions enough for said amorphous regions to seep into said single crystal semiconductor region under said gate, and the conditions of intensity of the laser irradiation are conditions for only said amorphous regions to melt but for said single crystal semiconductor region not to melt.

12. The method of manufacturing a semiconductor device according to claim 11, wherein
a capacitance on said source side is 0.25 (fF/μm/side) or more.

13. The method of manufacturing a semiconductor device according to claim 11, wherein
said atoms to amorphize said single crystal semiconductor are of one element selected from among Si, Ge, As and Ar.

14. The method of manufacturing a semiconductor device according to claim 11, wherein at the occasion of said fourth step, a heat absorbing film is formed on the entire surface and the laser irradiation is performed through said heat absorbing film.

15. A method of manufacturing a semiconductor device having a gate, a source and a drain within a single crystal semiconductor region, comprising:

a first step of pattern forming said gate above said single crystal semiconductor region through a gate insulating film;

a second step of forming a side wall insulating film on side surfaces of said gate and introducing impurities to form deep, first junction regions;

a third step of removing said side wall insulating film and thereafter introducing atoms to amorphize said single crystal semiconductor into a surface of said single crystal semiconductor region with said gate as a mask to form amorphous regions;

before or after said second step, a fourth step of introducing impurities into said amorphous regions of said single crystal semiconductor region with said gate as a mask to form shallow, second junction regions; and a fifth step of activating said impurities in said first and second junction regions by executing laser irradiation on at least said amorphous regions to form the source and the drain, wherein conditions of introducing said atoms in said third step and conditions of intensity of the laser irradiation in said fifth step are controlled respectively to form parts of the source and the drain corresponding to said amorphous regions to seep into said single crystal semiconductor region under said gate; and wherein the conditions of introducing said atoms are conditions enough for said amorphous regions to seep into said single crystal semiconductor region under said gate, and the conditions of intensity of the laser irradiation are conditions for only said amorphous regions to melt but for said single crystal semiconductor region not to melt.

16. The method of manufacturing a semiconductor device according to claim 15, wherein a capacitance on said source side is 0.25 (fF/μm/side) or more.

17. The method of manufacturing a semiconductor device according to claim 15, wherein said atoms to amorphize said single crystal semiconductor are of one element selected from among Si, Ge, As and Ar.

18. The method of manufacturing a semiconductor device according to claim 15, wherein at the occasion of said fifth step, a heat absorbing film is formed on the entire surface and the laser irradiation is performed through said heat absorbing film.

19. A method of manufacturing a semiconductor device having a gate, a source and a drain within a single crystal semiconductor region, comprising:

a first step of pattern forming said gate above said single crystal semiconductor region through a gate insulating film;

a second step of introducing atoms to amorphize said single crystal semiconductor from oblique directions to a surface of said single crystal semiconductor region with said gate as a mask to form amorphous regions seeping into said single crystal semiconductor region under said gate;

before or after said second step, a third step of introducing impurities into said amorphous regions of said single crystal semiconductor region with said gate as a mask; and a fourth step of activating said impurities by executing laser irradiation on at least said amorphous region to form the source and the drain, wherein in said second step, tilt angles of the introduction of said atoms with respect to a direction vertical to the surface of said single crystal semiconductor region are controlled to be greater on said source side than on said drain side so as to form said amorphous regions such that an amount of seeping into said single crystal semiconductor region under said gate is greater on said source side than on said drain side; and a capacitance on said source side is 0.25 (fF/μm/side) or more.

20. The method of manufacturing a semiconductor device according to claim 19, wherein said atoms to amorphize said single crystal semiconductor are of one element selected from among Si, Ge, As and Ar.

21. The method of manufacturing a semiconductor device according to claim 19, wherein at the occasion of said fourth step, a heat absorbing film is formed on the entire surface and the laser irradiation is performed through said heat absorbing film.

* * * * *